(12) United States Patent
 Kostamo

(10) Patent No.: US 9,840,775 B2
(45) Date of Patent: Dec. 12, 2017

(54) METHOD AND APPARATUS FOR PROCESSING PARTICULATE MATERIAL

(71) Applicant: Picosun Oy, Espoo (FI)

(72) Inventor: Juhana Kostamo, Espoo (FI)

(73) Assignee: Picosun Oy, Espoo (FI)

( * ) Notice: Subject to any disclaimer, the term of this patent is extended or adjusted under 35 U.S.C. 154(b) by 151 days.

(21) Appl. No.: 14/762,563

(22) PCT Filed: Jan. 23, 2013

(86) PCT No.: PCT/FI2013/050073
§ 371 (c)(1),
(2) Date: Jul. 22, 2015

(87) PCT Pub. No.: WO2014/114844
PCT Pub. Date: Jul. 31, 2014

(65) Prior Publication Data
US 2015/0361552 A1    Dec. 17, 2015

(51) Int. Cl.
*C23C 16/00* (2006.01)
*C23C 16/455* (2006.01)
*C23C 16/44* (2006.01)
*C23C 16/458* (2006.01)

(52) U.S. Cl.
CPC .... *C23C 16/45544* (2013.01); *C23C 16/4412* (2013.01); *C23C 16/4417* (2013.01); *C23C 16/458* (2013.01); *C23C 16/45555* (2013.01)

(58) Field of Classification Search
None
See application file for complete search history.

(56) References Cited

U.S. PATENT DOCUMENTS

| | | | | |
|---|---|---|---|---|
| 2,990,807 | A * | 7/1961 | Gerow | B22F 1/025 106/404 |
| 3,251,337 | A * | 5/1966 | Latta | B01J 2/006 118/303 |
| 6,015,597 | A * | 1/2000 | David | B01J 2/006 427/122 |
| 6,428,847 | B1 * | 8/2002 | Grant | C23C 16/455 118/715 |
| 2006/0196418 | A1 | 9/2006 | Lindfors et al. | |
| 2011/0236575 | A1 | 9/2011 | King et al. | |
| 2012/0009343 | A1 | 1/2012 | Van Ommen | |

OTHER PUBLICATIONS

Extended European Search Report, Application No. 13872551.0-1373/2948573 PCT/FI2013050073, dated May 6, 2016, 6 pages.

(Continued)

*Primary Examiner* — Mandy Louie
(74) *Attorney, Agent, or Firm* — Ziegler IP Law Group, LLC

(57) ABSTRACT

An apparatus and method for arranging a precursor vapor flow through a vertical atomic layer deposition (ALD) cartridge along a top-to-bottom vertical channel in a central area of the cartridge, and for moving particulate material to be ALD processed in the cartridge upwards, upon rotation, by a threaded area substantially extending from the vertical channel to a side wall of the cartridge, and downwards along the vertical channel to cause the particulate material to cycle during ALD processing.

5 Claims, 3 Drawing Sheets

(56) References Cited

OTHER PUBLICATIONS

McCormick, J.A. et. al., "Rotary reactor for atomic layer deposition on large quantities of nanoparticles", J. Vac. Sci. Technol. A 25 (1), Jan./Feb. 2007, pp. 67-74; whole document; see especially fig. 3.
International Search Report; PCT/FI2013/050073; dated Jul. 10, 2013; 4 pages.

* cited by examiner

METHOD AND APPARATUS FOR PROCESSING PARTICULATE MATERIAL

FIELD OF THE INVENTION

The present invention generally relates to deposition reactors. More particularly, the invention relates to atomic layer deposition reactors in which material is deposited on surfaces by sequential self-saturating surface reactions.

BACKGROUND OF THE INVENTION

Atomic Layer Epitaxy (ALE) method was invented by Dr. Tuomo Suntola in the early 1970's. Another generic name for the method is Atomic Layer Deposition (ALD) and it is nowadays used instead of ALE. ALD is a special chemical deposition method based on the sequential introduction of at least two reactive precursor species to at least one substrate.

Thin films grown by ALD are dense, pinhole free and have uniform thickness. For example, in an experiment aluminum oxide has been grown by thermal ALD from trimethylaluminum $(CH_3)_3Al$, also referred to as TMA, and water at 250-300° C. resulting in only about 1% non-uniformity over a substrate wafer.

One interesting application of ALD technique is coating of small particles. It may be desirable, for example, to deposit a thin coating on particles to alter the surface properties of these particles while maintaining their bulk properties.

SUMMARY

According to a first example aspect of the invention there is provided a method comprising:
arranging a precursor vapor flow through a vertical atomic layer deposition (ALD) cartridge along a top-to-bottom vertical channel in a central area of the cartridge; and
moving particulate material to be ALD processed in the cartridge upwards, upon rotation, by a threaded area substantially extending from the vertical channel to a side wall of the cartridge, and downwards along the vertical channel to cause the particulate material to cycle during ALD processing.

The particulate material may be powder or more coarse material, such as for example diamonds or similar. The cartridge may have a circular cross section. In certain example embodiments, the cartridge is of a cylindrical form, or for example, a conical frustum placed upside down.

In certain example embodiments, the vertical channel has an edge wall. In other embodiments, the vertical channel is without an edge wall. In the latter embodiments, the vertical channel extends in the side direction to the point at which the threaded area begins (that is, to an imaginary edge wall or outline). In certain example embodiments, the threaded area extends from the edge wall or virtual edge wall of the vertical channel to the cartridge side wall.

In certain example embodiments, the threaded area comprises one or more threads. In certain example embodiments, a thread is a structure that is wrapped inside the (hollow) cartridge so that it travels around the vertical channel (outside of it) obliquely towards the top of the cartridge. In certain example embodiments, a thread may be in the form of a ridge or a shelf. In certain example embodiments, a thread is in the form of a curved shelf or protrusion. The protrusion may protrude from the side wall of the cartridge towards the vertical channel. Alternatively, the protrusion may protrude from the edge wall of the vertical channel (if present) towards the side wall of the cartridge. In further embodiments, the thread may be a curved shelf between the vertical channel and cartridge side wall attached to both the vertical channel edge wall (if present) and the cartridge side wall.

A thread may have a thread start at the bottom of the cartridge and an end at the top of the cartridge. It may travel from the bottom to the top as an internal thread on the side wall. A thread may be a helical structure. A thread may be attached to one or more thread supports. The inner side of the cartridge side wall and/or the outer side of the vertical channel edge wall (if present) may act as a thread support.

The threaded area may have more than one thread. Accordingly, the threaded area may be with one start or two starts, or more starts. A thread may slope towards the side wall or towards the vertical channel, or it may be even (independently of the wall or support into which it is attached).

In certain example embodiments, the method comprises rotating the whole cartridge. In certain other example embodiments, the method comprises rotating only a part of the cartridge. In certain example embodiments, only the threaded area inside the cartridge together with a thread support is rotated. Accordingly, in certain example embodiments, a thread or threads (in case there are more) together with the vertical channel edge wall are rotated, whereas the side wall of the cartridge is stationary. In other example embodiments, a thread or threads (in case there are more) together with the side wall of the cartridge are rotated, whereas the vertical channel edge wall is stationary. In other example embodiments, a thread or threads (in case there are more) may be supported by supports other than the cartridge side wall and the vertical channel edge wall (if any). Accordingly, in these embodiments, the thread or threads (in case there are more) together with the (separate) thread supports are rotated, whereas the cartridge side wall is statutory and the vertical channel edge wall (if any) is statutory.

In certain example embodiments, the method comprises: moving the particulate material upwards by a combined movement of rotation and shaking. Similarly scenarios as with the preceding rotation-only embodiments can be implemented. Accordingly, the whole cartridge or only a part of the cartridge may be rotated and shaken.

In certain example embodiments, the combined movement of rotation and shaking comprises consecutive movements consisting of lifting, rotating, and lowering. This movement may be applied to the whole cartridge or only to a part of the cartridge. Similar scenarios as with the preceding rotation-only embodiments can be implemented.

In certain example embodiments, the cartridge comprises a first particle filter on the top of the cartridge and a second particle filter on the bottom of the cartridge. The first particle filter allows precursor vapor and inactive gas to enter the vertical channel but prevents the particulate material from travelling out of the cartridge. The second particle filter allows reaction and inactive gases to exit the vertical channel (and the cartridge) to an exhaust line but prevents the particulate material from travelling out of the cartridge.

In certain example embodiments, the rotating movement, or rotating and shaking movement, is transmitted to the cartridge along a gas exhaust line.

In certain example embodiments, the method comprises: exposing the particulate material to temporally separated precursor pulses in the cartridge to deposit material on the surface of the particulate material by sequential self-saturating surface reactions.

According to a second example aspect of the invention there is provided an apparatus, comprising:
a rotatable vertical atomic layer deposition (ALD) cartridge comprising a hollow space defined by a side wall;
a vertical channel in a central area of the cartridge vertically extending substantially throughout the cartridge configured to allow top-to-bottom flow of precursor vapor through the cartridge; and
a threaded area within the hollow space substantially extending from the vertical channel to the side wall, wherein
the apparatus is configured to move particulate material to be ALD processed upwards by the threaded area, upon rotation, and downwards along the vertical channel to cause the particulate material to cycle during ALD processing.

In certain example embodiments, the threaded area comprises a screw thread.

In certain example embodiments, the apparatus is configured to move the particulate material upwards by a combined movement of rotation and shaking.

In certain example embodiments, the combined movement of rotation and shaking comprises consecutive movements consisting of lifting, rotating, and lowering.

In certain example embodiments, the apparatus comprises a reaction chamber housing the cartridge and providing the cartridge with precursor vapor in-feed. In certain example embodiments, the apparatus comprises a vacuum chamber surrounding the reaction chamber.

In certain example embodiments, the apparatus comprises a rotator connected to the cartridge but located outside of a reaction chamber housing the cartridge. In certain example embodiments, the apparatus comprises a rotator and a shaker connected to the cartridge but located outside of a reaction chamber housing the cartridge.

In certain example embodiments, the rotator is attached into an exhaust line. In certain example embodiments, the shaker is attached into an exhaust line. In certain example embodiments, the rotator and shaker is a combined module attached into an exhaust line. In certain example embodiments, both the rotation and shaking is transmitted via a single vertical transmission rod. In certain example embodiments, the rotating movement (or the rotating and shaking movement) is transmitted from the bottom side of the ALD cartridge. In certain example embodiments, the rotating movement (or the rotating and shaking movement) is transmitted via an exhaust line feedthrough. In certain example embodiments, the vertical transmission rod is located within an exhaust line.

Different non-binding example aspects and embodiments of the present invention have been illustrated in the foregoing. The above embodiments are used merely to explain selected aspects or steps that may be utilized in implementations of the present invention. Some embodiments may be presented only with reference to certain example aspects of the invention. It should be appreciated that corresponding embodiments may apply to other example aspects as well. Any appropriate combinations of the embodiments may be formed.

BRIEF DESCRIPTION OF THE DRAWINGS

The invention will now be described, by way of example only, with reference to the accompanying drawings, in which.

DETAILED DESCRIPTION

In the following description, Atomic Layer Deposition (ALD) technology is used as an example. The basics of an ALD growth mechanism are known to a skilled person. As mentioned in the introductory portion of this patent application, ALD is a special chemical deposition method based on the sequential introduction of at least two reactive precursor species to at least one substrate. The at least one substrate is exposed to temporally separated precursor pulses in the reaction chamber to deposit material on the substrate surfaces by sequential self-saturating surface reactions.

A basic ALD deposition cycle consists of four sequential steps: pulse A, purge A, pulse B and purge B. Pulse A consists of a first precursor vapor and pulse B of another precursor vapor. Inactive gas and a vacuum pump are used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness. Deposition cycles can also be more complex. For example, the cycles can include three or more reactant vapor pulses separated by purging steps. All these deposition cycles form a timed deposition sequence that is controlled by a logic unit or a microprocessor.

In certain example embodiments as described in the following, thin conformal coatings are provided onto the surfaces of various particulate materials. The size of the particles depends on the particular material and the particular application. Suitable particle sizes typically range from the nanometer range up to the micrometer range, or even up to larger particles depending on the application. A wide variety of particulate materials can be used. The composition of a base particle and that of the coating is typically selected together so that the surface characteristics of the particle are modified in a way that is desirable for a particular application. The base particles preferably have some functional group on the surface that participates in an ALD reaction sequence that creates the coating.

Figure 1:
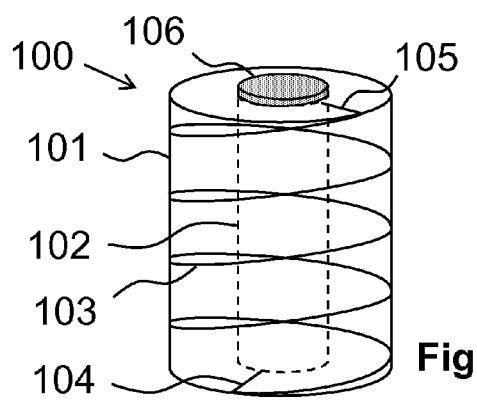
FIG. 1 shows a side view of an ALD cartridge in accordance with an example embodiment.
Figure 2:
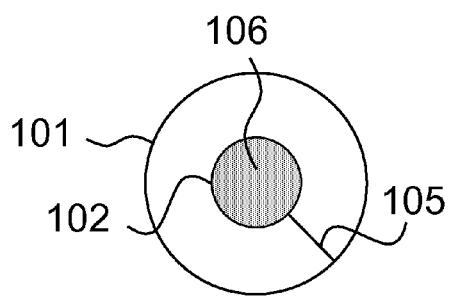
FIG. 2 shows a top view of the ALD cartridge of FIG. 1 in accordance with an example embodiment.

FIG. 1 shows a side view and FIG. 2 a top view of an ALD cartridge in accordance with an example embodiment. In this embodiment, the ALD cartridge 100 (hereinafter cartridge 100) has a circular cross section. The cartridge 100 is of a cylindrical form, although in other embodiments, it may be of another form, for example, a conical frustum placed upside down.

The cartridge 100 comprises a side wall 101 defining a hollow space. In the hollow space the cartridge 100 comprises a vertical channel 102. The vertical channel 102 resides in a central area of the cartridge 100, and it extends vertically substantially throughout the cartridge 100.

The vertical channel 102 is defined on its top side by a first particle filter 106. The first particle filter 106 may cover only the area of the vertical channel 102 (as drawn in FIG. 1) or it may cover a larger area of the cartridge top. On the bottom side the vertical channel 102 is defined by a second particle filter (not shown in FIGS. 1 and 2).

In the hollow space, the cartridge 100 comprises a threaded area around the vertical channel 102 sideways. The threaded area extends from the edge of the vertical channel 102 to the cartridge side wall 101. The threaded area comprises one on more threads 103. In the drawing of FIG. 1, one thread 103 is visible. The thread 103 is a structure that is wrapped inside the (hollow) cartridge 100 so that it travels around the vertical channel 102 (outside of it) obliquely towards the top of the cartridge 100. In this embodiment, the thread 103 is a curved shelf. The thread 103 starts at thread start 104 on the bottom of the cartridge 100, and it ends at thread end 105 at the top of the cartridge 100.

The cartridge 100 comprises particulate material to be ALD processed. When the cartridge 100 is rotated, the particulate material moves upwards along the thread 103. The route of the particulate material is shown by the arrows in FIG. 3. Accordingly, when the cartridge 100 is rotated as illustrated by the arrow 310, the particulate material moves from the thread start 104 at the bottom of the cartridge 100 along the thread 103 by the curved track formed by the thread 103 to the thread end 105. At the thread end 105, the particulate material moves into the vertical channel 102 and downwards along the vertical channel 102 back to the bottom. This way the particulate material is caused to cycle during ALD processing. The particulate filters are not shown in FIGS. 3-6.

The vertical channel 102 is configured to allow top-to-bottom flow of precursor vapor through the cartridge 100. The first particle filter 106 allows precursor vapor and inactive gas to enter the vertical channel 102 but prevents the particulate material from travelling out of the cartridge 100. Similarly, the second particle filter allows reaction and inactive gases to exit the vertical channel 102 (and the cartridge 100) to an exhaust line (not shown in FIGS. 1-3) but prevents the particulate material from travelling to the outside of the cartridge 100.

Additionally, the cartridge 100 may be shaken as illustrated by the arrow 311. In an example embodiment, the cartridge 100 is rapidly lifted and then rotated. This causes the particulate material to travel uphill along the thread 103. Subsequently, the cartridge 100 is lowered to its original position. The sequence of lifting, rotating and lowering is repeated for continuous uphill movement of the particulate material.

Figure 3:
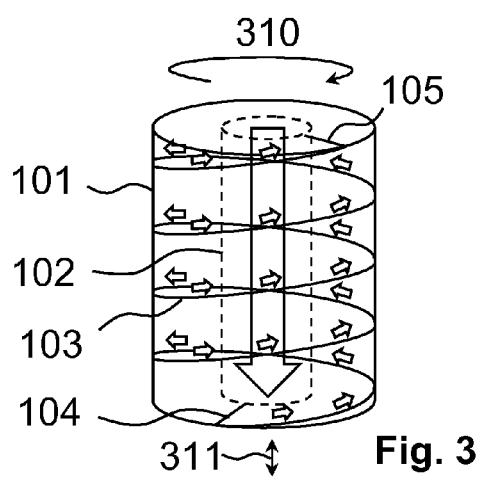
FIG. 3 shows particulate material propagation directions within the deposition cartridge of FIG. 1 in accordance with an example embodiment.
Figure 4:
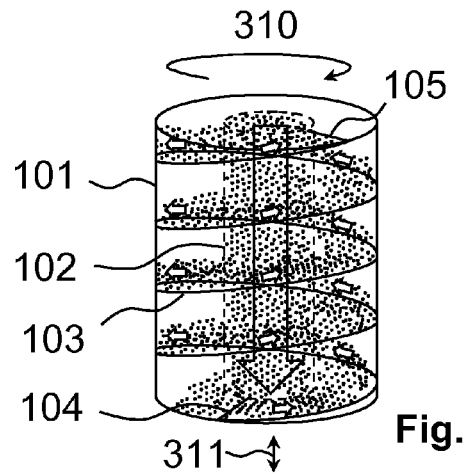
FIG. 4 shows another illustration of the embodiment shown in FIG. 3.

FIG. 4 shows another illustration of the embodiment shown in FIG. 3. What is shown in FIG. 4 corresponds to that shown in FIG. 3, but in addition FIG. 4 also illustrates by small dots the particulate material particles traveling around the cartridge 100.

Figure 5:
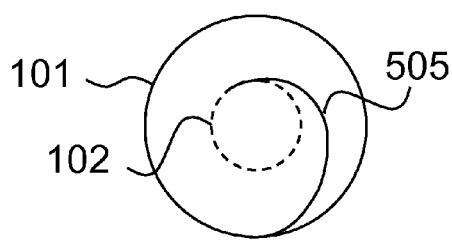
FIG. 5 shows a top view of an ALD cartridge in accordance with another example embodiment.
Figure 6:
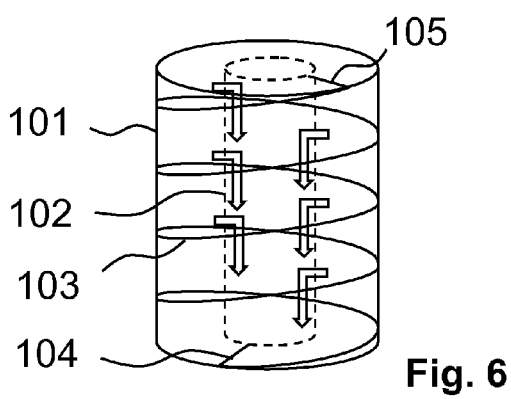
FIG. 6 shows particulate material propagation directions within an ALD cartridge in accordance with another example embodiment.

FIG. 5 shows a top view of an ALD cartridge in accordance with another example embodiment. In order to prevent the particulate material from being trapped at the thread end, the thread end 505 (in FIG. 5) may be formed so that it drives the particulate material into the vertical channel 102. In FIG. 5, the thread end is formed as a spiral in the top view. However, other shapes are possible in other embodiments.

As shown in the preceding, a thread 103 may be in the form of a shelf. In alternative embodiments, the thread may be of another form, for example, in the form of a ridge. In certain example embodiments, such as in the example embodiment shown in FIG. 6, the vertical channel 102 is without edge walls. In these embodiments, the particulate material may drop into the vertical channel 102 also during the journey to the thread end 105 as illustrated by the arrows shown in FIG. 6.

Depending on whether the vertical channel 102 has an edge wall, the following alternatives can be identified: the thread 103 may be a curved protrusion protruding from the edge wall; the thread 103 may be a curved protrusion protruding from the side wall 101; and the thread 103 may be a curved shelf between the vertical channel 102 and cartridge side wall 101 attached to both the edge wall and the cartridge side wall 101. In the first and second alternative, in some embodiments, there can be a small interval between the curved protrusion and the side wall 101 or the edge wall (if any), respectively. The first and second alternative then make it possible to rotate (or rotate and shake) only part of the cartridge 100, instead of rotating (or rotating and shaking) the whole cartridge 100. Namely, in the first alternative, the cartridge side wall 101 can be stationary, while the interior of the cartridge rotates (or rotates and shakes). In the second alternative, the vertical channel edge wall can be stationary, while the threaded area and the cartridge side wall rotate.

The thread 103 as shown in FIGS. 1-6 (as well as possible other threads not show) may travel from the cartridge bottom to the top as an internal thread on the side wall 101. The thread 103 may be a helical structure. The thread 103 may be attached to one or more thread supports. The inner side of the cartridge side wall 101 and/or the outer side of the vertical channel edge wall (if present) may act as a thread support. Alternatively, there may be separate supports instead.

The lead of the thread 103 depends on the implementation. The threaded area may have more than one thread. Accordingly, the threaded area may be with one start or two starts, or more starts. A thread may slope towards the side wall 101 or towards the vertical channel 102, or it may be even (independently of the wall or support into which it is attached).

Figure 9A:
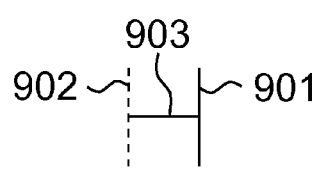
FIGS. 9-11 show threads within ALD cartridges in accordance with various example embodiments.
Figure 9B:
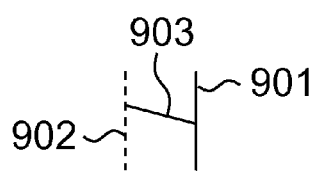
Figure 9C:
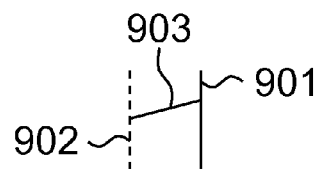

FIG. 9A shows an even thread 903 between the vertical channel edge or edge wall 902 and cartridge side wall 901. FIG. 9B shows a thread 903 sloping towards the side wall 901, whereas FIG. 9C shows a thread 903 sloping towards the vertical channel edge or edge wall 902.

Figure 10A:
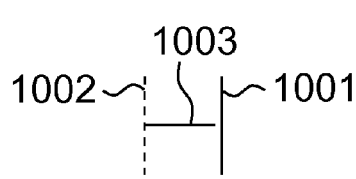
Figure 10B:
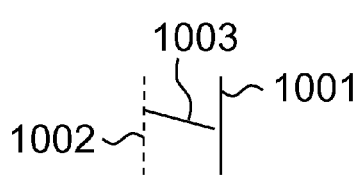
Figure 10C:
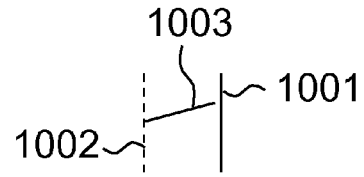

FIGS. 10A-10C show curved protrusion threads 1003 where there is a small interval between the curved protrusion thread 1003 and the cartridge sidewall 1001. FIG. 10A shows an even thread 1003 between the vertical channel edge wall 1002 and cartridge side wall 1001. FIG. 10B shows a thread 1003 sloping towards the side wall 1001, whereas FIG. 10C shows a thread 1003 sloping towards the vertical channel edge wall 1002.

Figure 11A:
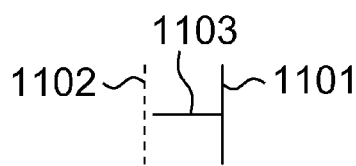
Figure 11B:
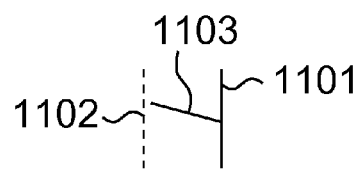
Figure 11C:
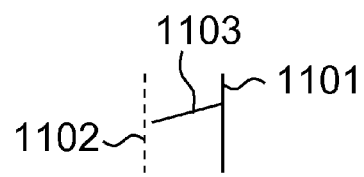

FIGS. 11A-11C show curved protrusion threads 1103 where there is a small interval between the curved protrusion thread 1103 and the vertical channel edge wall 1102. FIG. 11A shows an even thread 1103 between the vertical channel edge wall 1102 and cartridge side wall 1101. FIG. 11B shows a thread 1103 sloping towards the side wall 1101, whereas FIG. 11C shows a thread 1103 sloping towards the vertical channel edge wall 1102.

Figure 7:
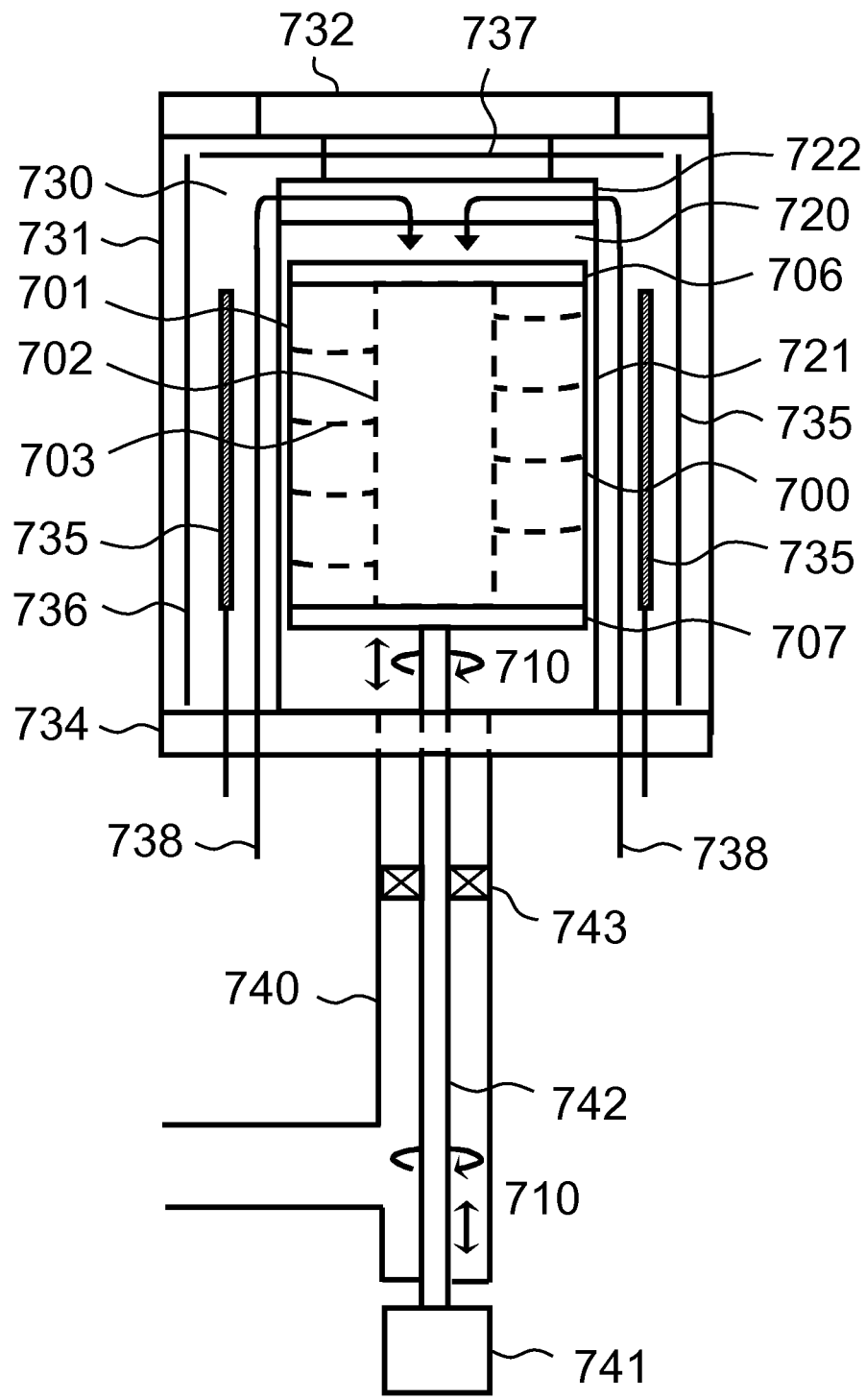
FIG. 7 shows a side view of an ALD reactor in accordance with an example embodiment.

FIG. 7 shows a side view of an ALD reactor in accordance with an example embodiment. The ALD reactor comprises a particulate material atomic layer deposition cartridge 700 (hereinafter cartridge 700).

The cartridge 700 comprises a side wall 701 defining a hollow space. In the hollow space the cartridge 700 comprises a vertical channel 702. The vertical channel 702 resides in a central area of the cartridge 700, and it extends vertically substantially throughout the cartridge 700.

The vertical channel 702 is defined on its top side by a first particle filter 706. On the bottom side the vertical channel 702 is defined by a second particle filter 707.

In the hollow space, the cartridge 700 comprises a threaded area around the vertical channel 702 sideways. The threaded area extends from the edge of the vertical channel 702 to the cartridge side wall 701. The threaded area comprises one on more threads 703.

The ALD reactor comprises a reaction chamber 720. The reaction chamber 720 is limited on its sides by a reaction chamber wall(s) 721. On its top side, the reaction chamber is closed by a reaction chamber lid 722. The reaction chamber is housed by a vacuum chamber 730. The vacuum chamber 730 is limited on its sides by a vacuum chamber wall(s) 731. On its top side, the vacuum chamber is closed by a vacuum chamber lid 732. The vacuum chamber lid 732 and the reaction chamber lid 722 may be integrated to form a dual-lid system. Furthermore, a heat reflector 737 may also be integrated to the lid system. The cartridge 700 can be loaded from the reactor top by opening the lid system.

The vacuum chamber comprises, in addition to the heat reflector 737, other heat reflectors, such as the heat reflectors 736 on the sides of the reaction chamber 720. The heat reflectors form a thermos bottle structure. Within said structure in the vacuum chamber 730 is placed reaction chamber heaters 735. The reaction chamber heaters 735 heat the reaction chamber 720 and the cartridge 700 inside it as desired.

The reaction chamber 730 is delimited on its bottom side by a reaction chamber flange 734. Electrical power to the reaction chamber heaters 735 is provided with conductors via feedthroughs through the flange 734. Precursor vapor and inactive gas in-feed lines 738 similarly travel through feedthroughs through the flange 734 into the vacuum chamber 730. Therefrom, the in-feed lines 738 travel via the reaction chamber lid 722 into the reaction chamber 720 providing the cartridge 700 with precursor vapor and inactive gas in-feed from the top side of the cartridge 700.

Below the reaction chamber 720, the ALD reactor comprises an exhaust line 740 which conducts reaction and inactive gases towards a vacuum pump (not shown). For that purpose, the reaction chamber (bottom) flange 734 has an exhaust line feedthrough. The exhaust line 740 branches below the reaction chamber 720 (the exhaust line 740 may form a T-junction, or similar). One branch (to the side in FIG. 7) leads to the vacuum pump. The other branch (down in FIG. 7) leads to a module 741. The module 741 may be a rotator module. Alternatively, the module 741 may be a rotator and shaker module. A vertical rod 742 attached to the module 741 at its lower end and to the cartridge 700 at its upper end is used as a transmission rod to rotate (or rotate and shake) the cartridge 700. The vertical rod 741 travels within the exhaust line 740. It goes through the vacuum chamber flange 734 via the exhaust line feedthrough. The vertical rod 741 may be supported to the exhaust line 740 by supports 743 between the module 741 and the vacuum chamber flange 734.

The cartridge 700 comprises particulate material to be ALD processed. During ALD processing, when the cartridge 700 is rotated as illustrated by the round arrow 710, a particulate material cycle similar to that shown in FIGS. 1-6 is established. The particulate material moves upwards along the thread 703 and downwards along the vertical channel 702. Additionally, the cartridge 700 may be shaken as illustrated by the up-and-down arrow 710. The particulate material is then moved by a combined movement of rotation and shaking as described in the foregoing.

The vertical channel 702 allows top-to-bottom flow of precursor vapor through the cartridge 700. The first particle filter 706 allows precursor vapor and inactive gas to enter the vertical channel 702 from a top part of the reaction chamber 720 but prevents the particulate material from travelling out of the cartridge 700. Similarly, the second particle filter allows reaction and inactive gases to exit the vertical channel 702 (and the cartridge 700) to the bottom part of the reaction chamber 720 and therefrom to the exhaust line 740 but prevents the particulate material from travelling to the outside of the cartridge 700.

Figure 8:
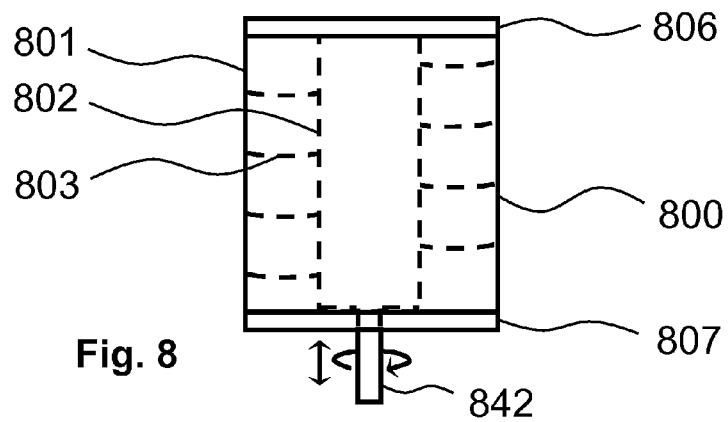
FIG. 8 shows a side view of an ALD cartridge in accordance with another example embodiment.

FIG. 8 shows a side view of an ALD cartridge in accordance with another example embodiment. The ALD cartridge 800 otherwise corresponds to the structure and operation to the ALD cartridge 700 except that, instead of the whole cartridge 700 being rotated (or rotated and shaken), in the embodiment of FIG. 8 only a part of the cartridge 800 is rotated (or rotated and shaken). As mentioned in the preceding, in alternative embodiments, the cartridge may have stationary parts that remain still while the other parts of the cartridge are rotated (or rotated and shaken). In the example embodiment of FIG. 8, the transmission rod 842 is connected to the vertical channel 802 to which the thread(s) 803 are attached. The transmission rod 842 therefore rotates (or rotates and shakes) only the edge wall of the vertical channel 802 and the thread(s) 803, while the cartridge side wall 801 and the first and second particle filters 806 and 807 remain still.

Without limiting the scope and interpretation of the patent claims, certain technical effects of one or more of the example embodiments disclosed herein are listed in the following: A technical effect is hindering the formation of agglomerates. Another technical effect is transmitting rotating movement, or rotating and shaking movement, to an ALD cartridge along a gas exhaust line.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means without deviating from the characteristics of the invention.

Furthermore, some of the features of the above-disclosed embodiments of this invention may be used to advantage without the corresponding use of other features. As such, the foregoing description should be considered as merely illustrative of the principles of the present invention, and not in limitation thereof. Hence, the scope of the invention is only restricted by the appended patent claims.

The invention claimed is:
1. A method comprising:
arranging a precursor vapor flow through a vertical atomic layer deposition (ALD) cartridge along a top-to-bottom vertical channel in a central area of the cartridge; and moving particulate material to be ALD processed in the cartridge upwards, upon rotation, by a threaded area substantially extending from the vertical channel to a side wall of the cartridge, and downwards along the vertical channel to cause the particulate material to cycle during ALD processing.

2. The method of claim 1, comprising:

moving the particulate material upwards by a combined movement of rotation and shaking.

3. The method of claim 2, wherein the combined movement of rotation and shaking comprises consecutive movements consisting of lifting, rotating, and lowering.

4. The method of claim 1, wherein the rotating movement, or rotating and shaking movement, is transmitted to the cartridge along a gas exhaust line.

5. The method of claim 1, comprising:

exposing the particulate material to temporally separated precursor pulses in the cartridge to deposit material on the surface of the particulate material by sequential self-saturating surface reactions.

* * * * *